US012737867B2

(12) United States Patent
Flanagan et al.

(10) Patent No.: US 12,737,867 B2
(45) Date of Patent: Sep. 15, 2026

(54) FEW-SHOT LEARNING FOR PROCESSING MICROSCOPY IMAGES

(71) Applicant: FEI Company, Hillsboro, OR (US)

(72) Inventors: John Flanagan, Hillsboro, OR (US); Andrei Novikov, Eindhoven (NL)

(73) Assignee: FEI COMPANY, Hillsboro, OR (US)

( * ) Notice: Subject to any disclaimer, the term of this patent is extended or adjusted under 35 U.S.C. 154(b) by 377 days.

(21) Appl. No.: 18/303,446

(22) Filed: Apr. 19, 2023

(65) Prior Publication Data

US 2024/0354924 A1 Oct. 24, 2024

(51) Int. Cl.
*G06T 7/00* (2017.01)
*H01J 37/244* (2006.01)

(52) U.S. Cl.
CPC .......... *G06T 7/0004* (2013.01); *H01J 37/244* (2013.01); *G06T 2200/24* (2013.01); *G06T 2207/10056* (2013.01); *G06T 2207/20081* (2013.01); *G06T 2207/20084* (2013.01); *G06T 2207/20092* (2013.01); *G06T 2207/30148* (2013.01); *H01J 2237/221* (2013.01)

(58) Field of Classification Search
None
See application file for complete search history.

(56) References Cited

U.S. PATENT DOCUMENTS 8,572,013 B1 * 10/2013 Nash ...................... G06F 16/35 706/20
10,719,301 B1 * 7/2020 Dasgupta .................. G06F 8/33
11,620,749 B2 * 4/2023 Wyder .................. G16H 30/40 382/131
11,705,245 B2 * 7/2023 Curtin .................. G06N 3/045 382/159
11,727,553 B2 * 8/2023 Varga .................. G06F 18/285 382/141
2011/0191271 A1 * 8/2011 Baker .................. G06N 20/00 706/46

(Continued)

OTHER PUBLICATIONS

European Patent Office Action for Application No. 20724819.6 dated Mar. 9, 2023 (6 pages).

*Primary Examiner* — Sath V Perungavoor
(74) *Attorney, Agent, or Firm* — Michael Best & Friedrich LLP

(57) ABSTRACT

Disclosed herein are scientific instrument support systems, as well as related methods, computing devices, and computer-readable media. For example, in some embodiments, a scientific instrument support apparatus may include: first logic to receive, from a charged particle microscope, a microscopy image of a sample; second logic to generate a first processed image by processing the microscopy image through a general machine-learning model trained using a plurality of previously processed microscopy images; third logic to retrain the general machine-learning model with a related microscopy image, wherein the related microscopy image includes a label of an object related to the sample and the related microscopy image is not included in the plurality of previously processed microscopy images; and fourth logic to generate a second processed image, different from the first processed image, by processing the microscopy image through the retrained general machine-learning model.

17 Claims, 9 Drawing Sheets

(56) References Cited

U.S. PATENT DOCUMENTS

| | | | | |
|---|---|---|---|---|
| 2015/0081599 | A1* | 3/2015 | Dobler | G01R 31/00 706/12 |
| 2019/0034822 | A1* | 1/2019 | Farré Guiu | G06N 5/022 |
| 2019/0228224 | A1* | 7/2019 | Guo | G06N 3/09 |
| 2019/0259041 | A1* | 8/2019 | Jackson | G06F 16/288 |
| 2019/0333199 | A1* | 10/2019 | Ozcan | G06N 3/047 |
| 2019/0362841 | A1* | 11/2019 | Aysin | G16H 40/60 |
| 2020/0272805 | A1* | 8/2020 | Flanagan | G06V 10/764 |
| 2020/0357516 | A1* | 11/2020 | Kirby | G16H 40/60 |
| 2021/0190882 | A1* | 6/2021 | He | G06N 3/045 |
| 2021/0312227 | A1* | 10/2021 | Moradiannejad | G06F 18/214 |
| 2022/0138903 | A1* | 5/2022 | Liu | G06T 3/4076 382/299 |
| 2022/0139095 | A1* | 5/2022 | Wu | G06N 3/045 382/137 |
| 2023/0015037 | A1* | 1/2023 | Kojima | G06T 17/00 |
| 2023/0230208 | A1* | 7/2023 | Lei | G06T 5/70 382/155 |

* cited by examiner

TRAINING DATA
302

TRAINING

MODEL
304

IDENTIFIED/
ANNOTATED
OBJECTS
309

UNSEEN SAMPLE IMAGE
306

PROCESSED IMAGE
308

FIG. 3

FEW-SHOT LEARNING FOR PROCESSING MICROSCOPY IMAGES

BACKGROUND

Charged particle microscopy has the potential to generate images of samples at very high resolution. These images are large data sets that often require significant processing to extract information of value.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, not by way of limitation, in the figures of the accompanying drawings.

FIG. 3 depicts an example machine-learning model trained to parse an image.

DETAILED DESCRIPTION

Disclosed herein are scientific instrument support systems, as well as related methods, computing devices, and computer-readable media. For example, in some embodiments, a scientific instrument support apparatus may include: first logic to receive, from a charged particle microscope, a microscopy image of a sample; second logic to generate a first processed image by processing the microscopy image through a general machine-learning model trained using a plurality of previously processed microscopy images; third logic to retrain the general machine-learning model with a related microscopy image, wherein the related microscopy image includes a label of an object related to the sample and the related microscopy image is not included in the plurality of previously processed microscopy images; and fourth logic to generate a second processed image, different from the first processed image, by processing the microscopy image through the retrained general machine-learning model.

Creating a machine-learning model often requires large (e.g., several thousand or more) dataset, which are often not readily obtainable for certain use cases. Accordingly, in some embodiments, the disclosed system is employed to reduce the quantity of data that is used to train a machine-learning model such as, for example, a semantic segmentation and object detection convolutional neural networks (e.g., a fully convolutional network (FCN), U-Net, single shot detector (SSD), and the like). In some embodiments, the disclosed system also reduces the training time of such machine-learning models to less than a minute when trained on, for example, a modern high-end graphics processing unit (GPU) such as Nvidia Quadro, or Tesla. In some embodiments, a machine-learning model is trained on a large and diverse dataset that encompasses much of the relevant data universe. For example, in the semiconductor industry, the data universe would include the information related to semiconductor devices. The trained machine-learning model is referred to herein as a general model. In some cases, the model generalizes after approximately 500 epochs of training.

Figure 4A:
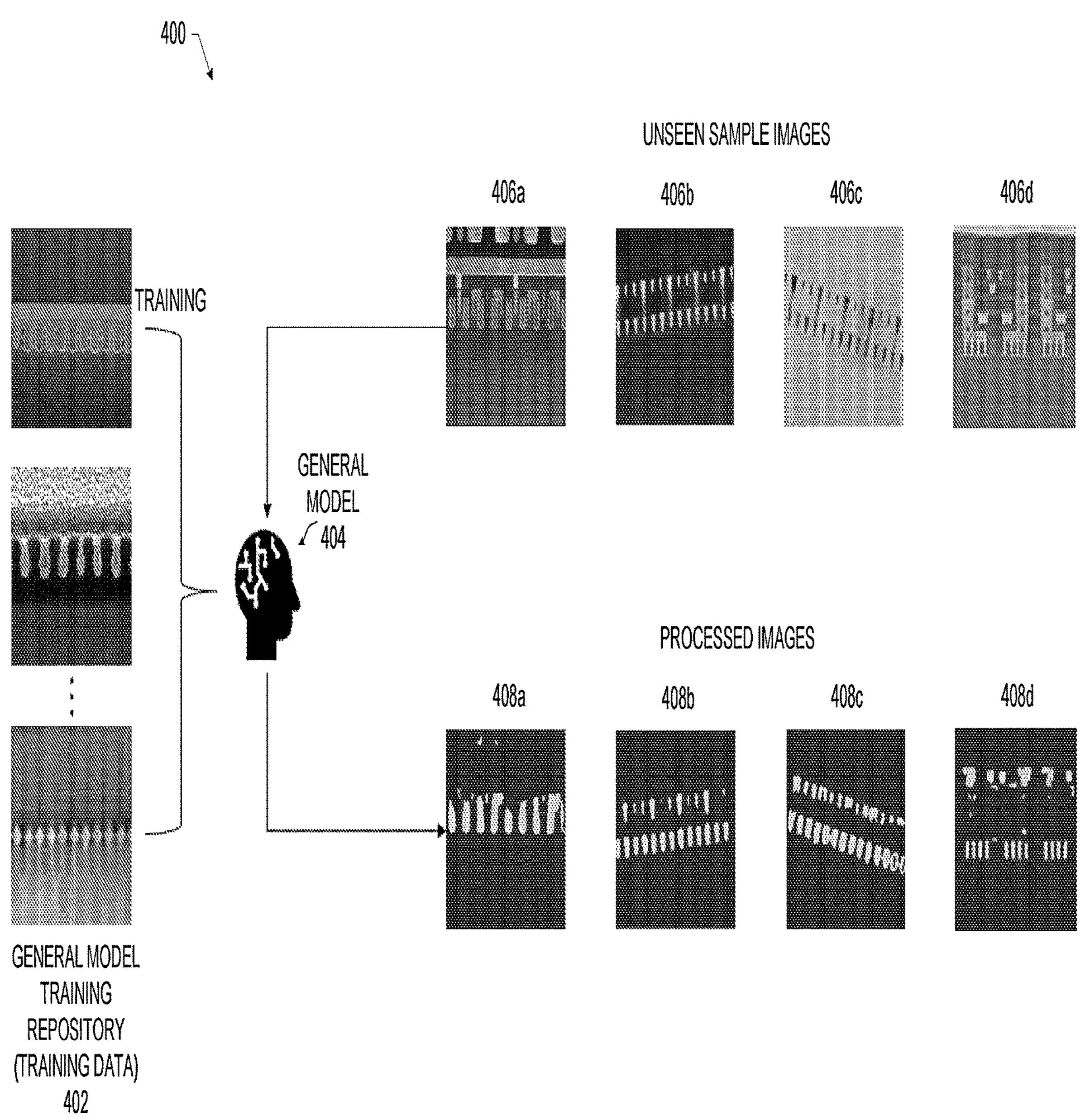
FIG. 4A depicts an example system for training a general model.

In some embodiments, once trained the general model can perform inference on previously unseen sample types (See FIG. 4A). In some cases, the performance of the general model is sufficient, so no further training is required. A such, a new device can be re-trained using the general model. In other cases, the general model is fine-tuned (few shot learning) for a specific application of the model by training the model using a few (e.g., 100, 50, 40, 30, 25, 20, 15, 10, 9, 8, 7, 6, 5, 4, 3, or 2) samples or even one sample for a short time to yield acceptable inference performance (See FIG. 4B). In some cases, for the retraining process, a previously trained model (e.g., a general model or one that has been fine-tuned) is use for initial weights to improve performance by reducing the number of training epochs and quality because the model will use previously gained knowledge (See FIG. 5 which depicts an example lifecycle of a model). In some cases, when a specific model is not available for the retraining procedure, the general model can be used.

In addition to creating device specific models by retraining the general model on new devices, the general model can be updated by adding these new training data examples to a general model training library. Accordingly, the performance of the general model improves as more data is added. Furthermore, in some cases, training can occur as a background process on a device with minimally impact to the device's performance. In some examples, the general model may become so specialized such that no retraining is necessary. This creates a positive feedback loop where the model improves as the system is used.

In the following detailed description, reference is made to the accompanying drawings that form a part hereof wherein like numerals designate like parts throughout, and in which is shown, by way of illustration, embodiments that may be practiced. It is to be understood that other embodiments may be utilized, and structural or logical changes may be made, without departing from the scope of the present disclosure. Therefore, the following detailed description is not to be taken in a limiting sense.

Various operations may be described as multiple discrete actions or operations in turn, in a manner that is most helpful in understanding the subject matter disclosed herein. However, the order of description should not be construed as to imply that these operations are necessarily order dependent. In particular, these operations may not be performed in the order of presentation. Operations described may be performed in a different order from the described embodiment.

Various additional operations may be performed, and/or described operations may be omitted in additional embodiments.

For the purposes of the present disclosure, the phrases "A and/or B" and "A or B" mean (A), (B), or (A and B). For the purposes of the present disclosure, the phrases "A, B, and/or C" and "A, B, or C" mean (A), (B), (C), (A and B), (A and C), (B and C), or (A, B, and C). Although some elements may be referred to in the singular (e.g., "a processing device"), any appropriate elements may be represented by multiple instances of that element, and vice versa. For example, a set of operations described as performed by a processing device may be implemented with different ones of the operations performed by different processing devices.

The description uses the phrases "an embodiment," "various embodiments," and "some embodiments," each of which may refer to one or more of the same or different embodiments. Furthermore, the terms "comprising," "including," "having," and the like, as used with respect to embodiments of the present disclosure, are synonymous. When used to describe a range of dimensions, the phrase "between X and Y" represents a range that includes X and Y. As used herein, an "apparatus" may refer to any individual device, collection of devices, part of a device, or collections of parts of devices. The drawings are not necessarily to scale.

Figure 1:
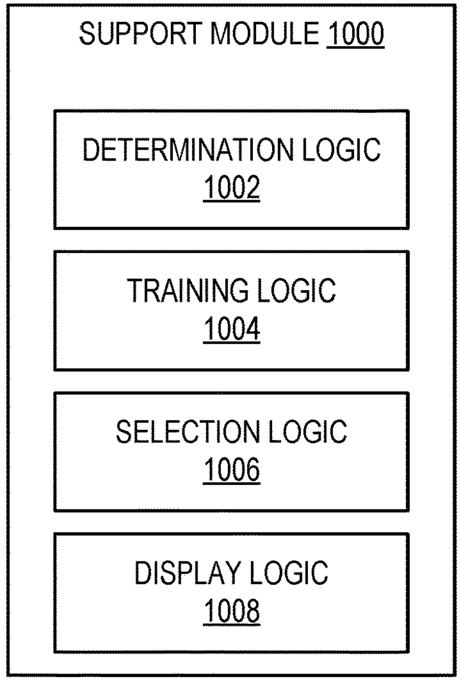
FIG. 1 is a block diagram of an example scientific instrument support module to perform an inference on previously unseen sample, in accordance with various embodiments.

FIG. 1 is a block diagram of a scientific instrument support module 1000 for performing support operations, in accordance with various embodiments. The scientific instrument support module 1000 may be implemented by circuitry (e.g., including electrical and/or optical components), such as a programmed computing device. The logic of the scientific instrument support module 1000 may be included in a single computing device or may be distributed across multiple computing devices that are in communication with each other as appropriate. Examples of computing devices that may, singly or in combination, implement the scientific instrument support module 1000 are discussed herein with reference to the computing device 4000 of FIG. 7, and examples of systems of interconnected computing devices, in which the scientific instrument support module 1000 may be implemented across one or more of the computing devices, is discussed herein with reference to the scientific instrument support system 5000 of FIG. 8.

The scientific instrument support module 1000 may include determination logic 1002, training logic 1004, model selection logic 1006, and display logic 1008. As used herein, the term "logic" may include an apparatus that is to perform a set of operations associated with the logic. For example, any of the logic elements included in the support module 1000 may be implemented by one or more computing devices programmed with instructions to cause one or more processing devices of the computing devices to perform the associated set of operations. In a particular embodiment, a logic element may include one or more non-transitory computer-readable media having instructions thereon that, when executed by one or more processing devices of one or more computing devices, cause the one or more computing devices to perform the associated set of operations. As used herein, the term "module" may refer to a collection of one or more logic elements that, together, perform one or more functions associated with the module. Different ones of the logic elements in a module may take the same form or may take different forms. For example, some logic in a module may be implemented by a programmed general-purpose processing device, while other logic in a module may be implemented by an application-specific integrated circuit (ASIC). In another example, different ones of the logic elements in a module may be associated with different sets of instructions executed by one or more processing devices. A module may not include all of the logic elements depicted in the associated drawing; for example, a module may include a subset of the logic elements depicted in the associated drawing when that module is to perform a subset of the operations discussed herein with reference to that module.

The determination logic 1002 may be configured to determine objects related to a sample (e.g., a semiconductor device) by processing a received microscopy image. In some embodiments, such an image is received from a charged particle microscope. Generally, charged particle microscopy involves using a beam of accelerated charged particles as a source of illumination. Types of charged particle microscopy include, for example, transmission electron microscopy, scanning electron microscopy, scanning transmission electron microscopy, and ion beam microscopy. In some embodiments, the determination logic 1002 employs a trained machine-learning model to provide a processed image from the received microscopy image. As noted above, trained machine-learning model may be a general machine-learning model trained with previously processed microscopy images related to the sample or a fine-tuned machine-learning model that was retrained (few shot learning) for a specific application using a few samples or even one sample for a short time to yield acceptable inference performance. In some embodiments, machine-learning model is a semantic segmentation and object detection convolutional neural networks.

The training logic 1004 may be configured to train the general machine-learning model used by the determination logic 1002 (e.g., trains a model with previously processed microscopy images), and to retrain (fine-tune) the general machine-learning model with using a few samples. Any suitable training technique for machine-learning models may be implemented by the training logic 1004, such as a gradient descent process using suitable loss functions. In some embodiments, to retrain the machine-learning computational model, the training logic 1004 may employ dropout or other regularization methods and may reserve some of the training data for use in validation and in assessing when to stop the retraining process. The training logic 1004 may perform such retraining on a regular chronological schedule (e.g., every week), after a certain number of confirmed image data sets accumulated (e.g., 20), in accordance with any other suitable schedule, or at the command of a user (e.g., received via a GUI, such as the GUI 3000 of FIG. 6.

The model selection logic 1006 may be configured to provide multiple general machine-learning models that may be selectively utilized by the determination logic 1002 to process received microscopy image data. The display logic 1008 may provide to a user, through a GUI (such as the GUI 3000 of FIG. 6), an option to select the machine learning model that they wish to use for a particular acquisition condition from a set of stored general machine-learning models (e.g., identified with different names) made available by the model selection logic 1006, and the selected machine-learning model may be used by the determination logic 1002 as described above.

Figure 2A:
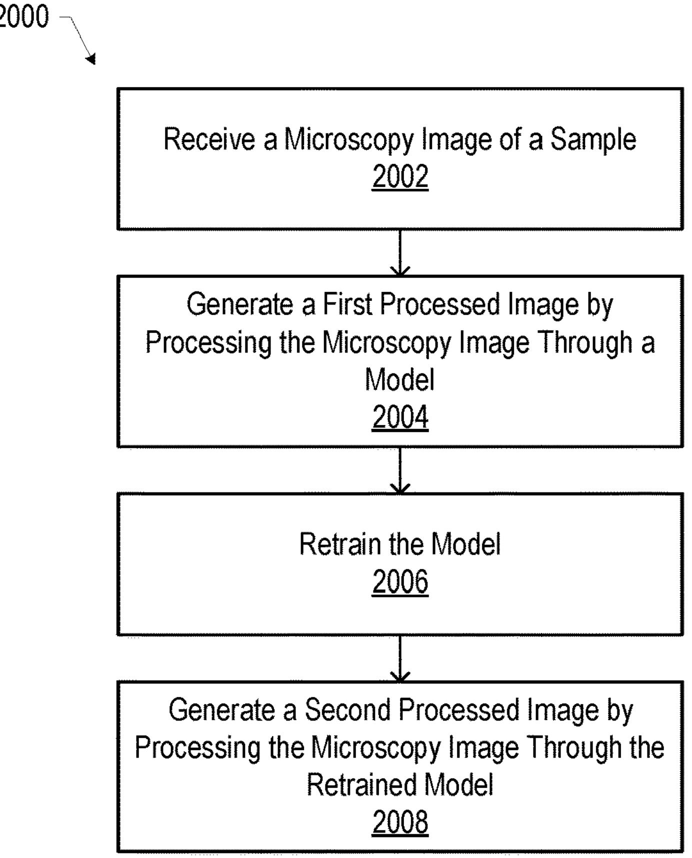
FIGS. 2A-2C each depict a flow diagram of an example method, in accordance with various embodiments.
Figure 2B:
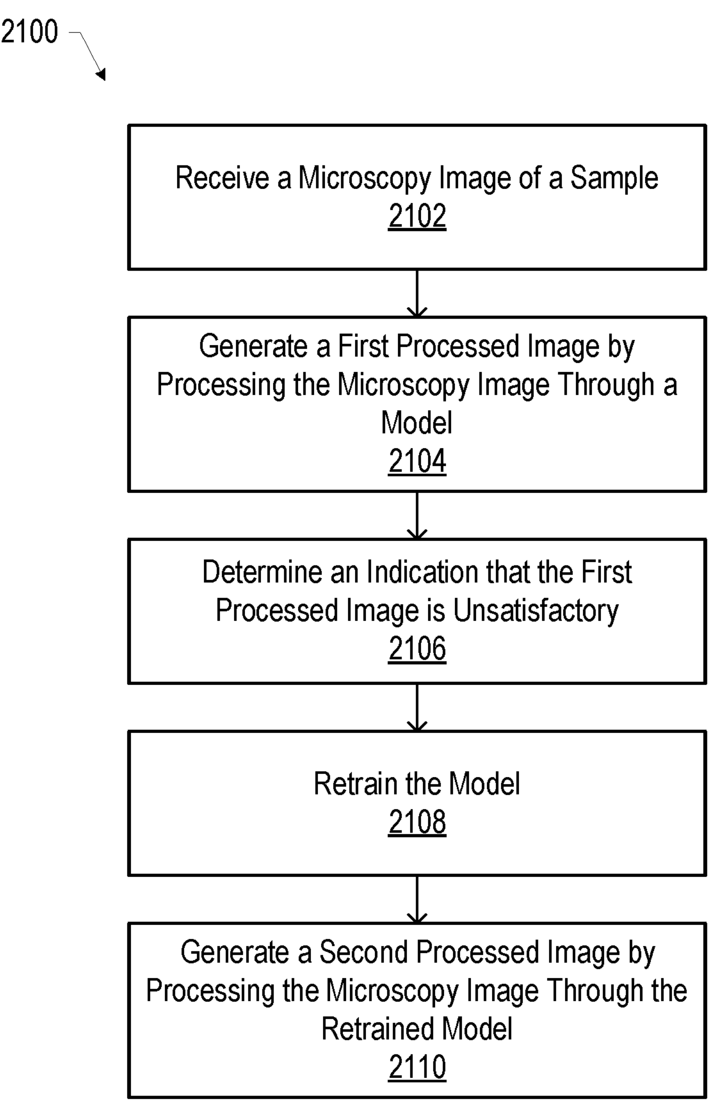
Figure 2C:
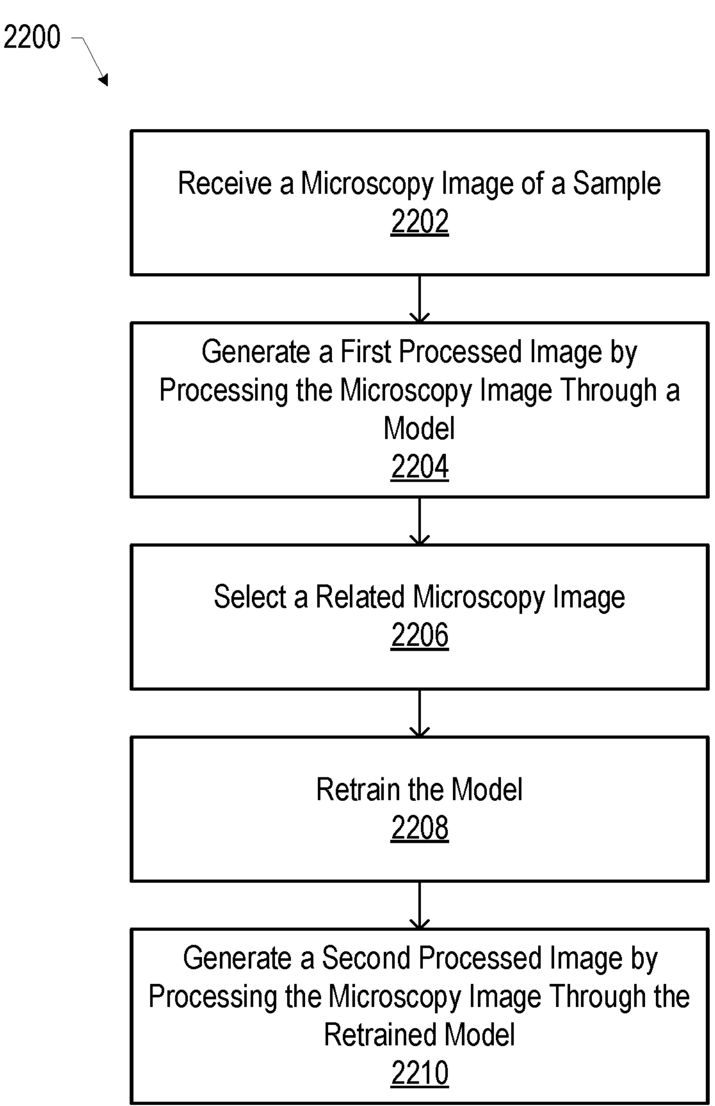

FIGS. 2A-2C each depict a flow diagram of a method 2000, 2100, and 2200 respectively of performing support operations, in accordance with various embodiments. Although the operations of the methods 2000, 2100, and 2200 may be illustrated with reference to particular embodiments disclosed herein (e.g., the scientific instrument support modules 1000 discussed herein with reference to FIG. 1, the GUI 3000 discussed herein with reference to FIG. 6, the computing devices 4000 discussed herein with reference to FIG. 7, and/or the scientific instrument support system 5000 discussed herein with reference to FIG. 8), the methods 2000, 2100, and 2200 may be used in any suitable setting to perform any suitable support operations. Operations are illustrated once each and in a particular order in FIGS. 2A-2C, but the operations may be reordered and/or repeated as desired and appropriate (e.g., different operations performed may be performed in parallel, as suitable).

For method 2000, at 2002, first operations may be performed. For example, the support module 1000 may perform the operations of 2002 (e.g., via receiving logic not shown in FIG. 1). The first operations may include receiving, from a charged particle microscope, a microscopy image of a sample.

At 2004, second operations may be performed. For example, the determination logic 1002 of the support module 1000 may perform the operations of 2004. The second operations may include generating a first processed image by processing the microscopy image through a general machine-learning model trained using a plurality of previously processed microscopy images.

At 2006, third operations may be performed. For example, the training logic 1004 of the support module 1000 may perform the operations of 2006. The third operations may include retraining the general machine-learning model with a related microscopy image, wherein the related microscopy image includes a label of an object related to the sample and the related microscopy image is not included in the plurality of previously processed microscopy images.

At 2008, fourth operations may be performed. For example, the determination logic 1002 of the support module 1000 may perform the operations of 2008. The fourth operations may include generating a second processed image, different from the first processed image, by processing the microscopy image through the retrained general machine-learning model.

For method 2100, at 2102, first operations may be performed. For example, the support module 1000 may perform the operations of 2102 (e.g., via receiving logic not shown in FIG. 1). The first operations may include receiving, from a charged particle microscope, a microscopy image of a sample.

At 2104, second operations may be performed. For example, the determination logic 1002 of the support module 1000 may perform the operations of 2104. The second operations may include generating a first processed image by processing the microscopy image through a general machine-learning model trained using a plurality of previously processed microscopy images.

At 2106, second operations may be performed. For example, the determination logic 1002 of the support module 1000 may perform the operations of 2106. The second operations may include determining an indication that the first processed image is unsatisfactory.

At 2108, third operations may be performed. For example, the training logic 1004 of the support module 1000 may perform the operations of 2108. The third operations may include retraining the general machine-learning model with a related microscopy image in response to the determination that the first processed image is unsatisfactory.

At 2110, fourth operations may be performed. For example, the determination logic 1002 of the support module 1000 may perform the operations of 2110. The fourth operations may include generating a second processed image, different from the first processed image, by processing the microscopy image through the retrained general machine-learning model.

For method 2200, at 2202, first operations may be performed. For example, the support module 1000 may perform the operations of 2202 (e.g., via receiving logic not shown in FIG. 1). The first operations may include receiving, from a charged particle microscope, a microscopy image of a sample.

At 2204, second operations may be performed. For example, the determination logic 1002 of the support module 1000 may perform the operations of 2204. The second operations may include generating a first processed image by processing the microscopy image through a general machine-learning model trained using a plurality of previously processed microscopy images.

At 2206, second operations may be performed. For example, the determination logic 1002 of the support module 1000 may perform the operations of 2206. The second operations may include selecting a related microscopy image based on a metric quantitating the similarity of the first processed image to an expected processing results of the microscopy image.

At 2208, third operations may be performed. For example, the training logic 1004 of the support module 1000 may perform the operations of 2208. The third operations may include retraining the general machine-learning model with the related microscopy image.

At 2210, fourth operations may be performed. For example, the determination logic 1002 of the support module 1000 may perform the operations of 2210. The fourth operations may include generating a second processed image, different from the first processed image, by processing the microscopy image through the retrained general machine-learning model.

General Model

Figure 3:
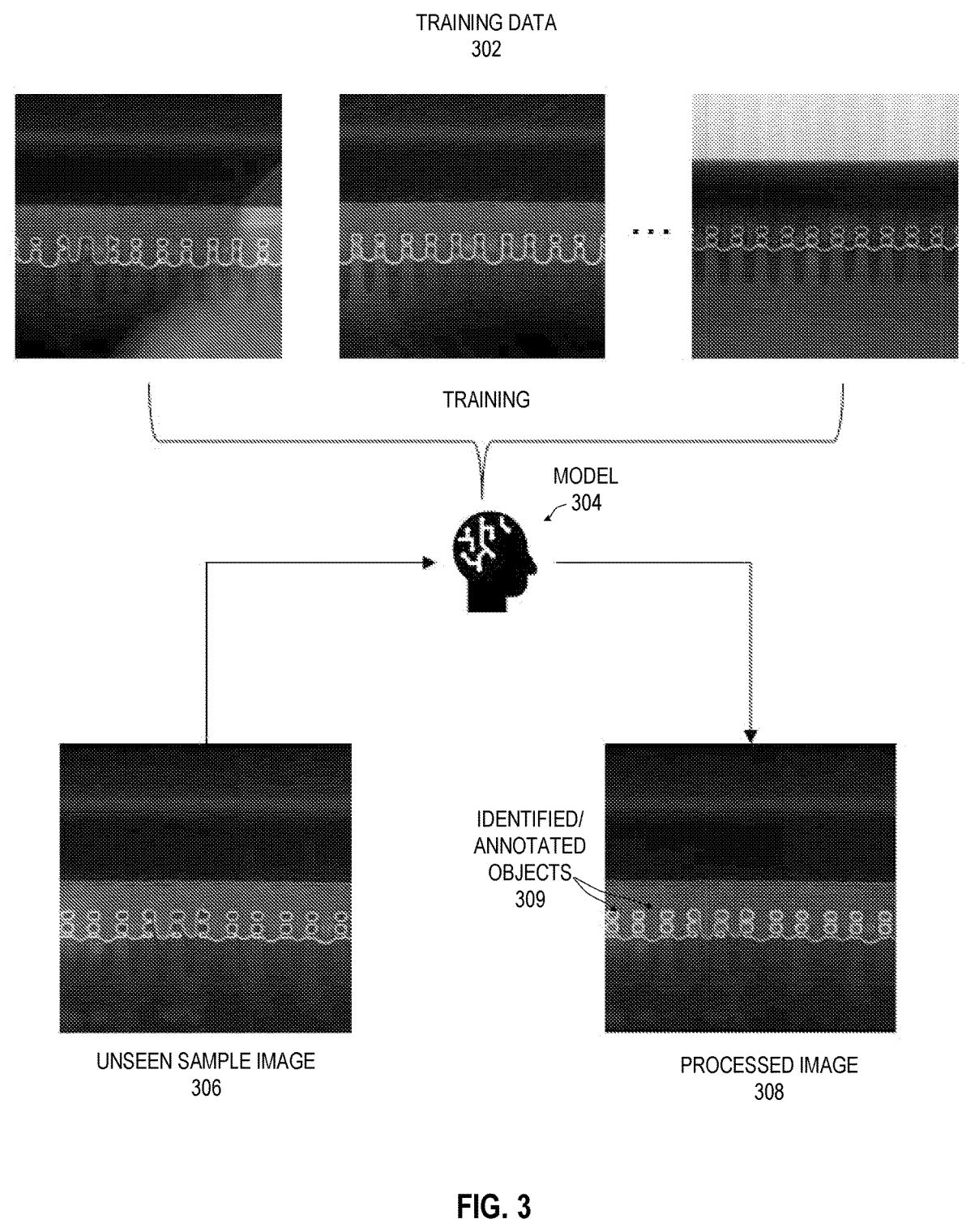

FIG. 3 depicts an example machine-learning model 304 trained to parse an image. The machine-learning model 304 is trained with training data 302. The unseen sample image 306 is processed through the model 304, which provides the processed image 308 that include identified or annotated objects 309. The images shown in FIG. 3 (as well as other figures) depict semiconductor devices (e.g., nanowires); however, the described system can be deployed to any application involving, for example, navigation, scene parsing, captioning, and the like. For example, the system may be employed defect detection, finding grids, fingers, all manner of computer vision tasks.

FIG. 4A depicts an example system 400 for training a general model 404. As depicted, the general model 404 is "pre-trained" using a training data from a repository 402. This training data include the available data (e.g., in house, annotated data) relevant to the particular application of system employing the general model 404.

In some embodiments, the general model 404 includes a deep learning model or semantic segmentation or an object detection convolutional neural network. In some embodiments, the general model 404 is trained to process microscopy images and identify objects in these images. For example, as depicted, the unseen sample images 406*a-d* are processed by through the general model 404 to produce the respective processed images 408*a-d*. In some embodiments, the general model 404 is pretrained with relevant and specific images (e.g., microscopy images) based on a projects or devices requirements. For example, in some embodiments, the general model 404 is pretrained with microscopy images such as transmission electron microscopy (TEM)

images or scanning electron microscopy (SEM) images of semiconductor components or devices. In some embodiments, the microscopy images include Energy Dispersive X-ray Spectroscopy (EDS) or Electron Energy Loss Spectroscopy (EELS) images.

Figure 4B:
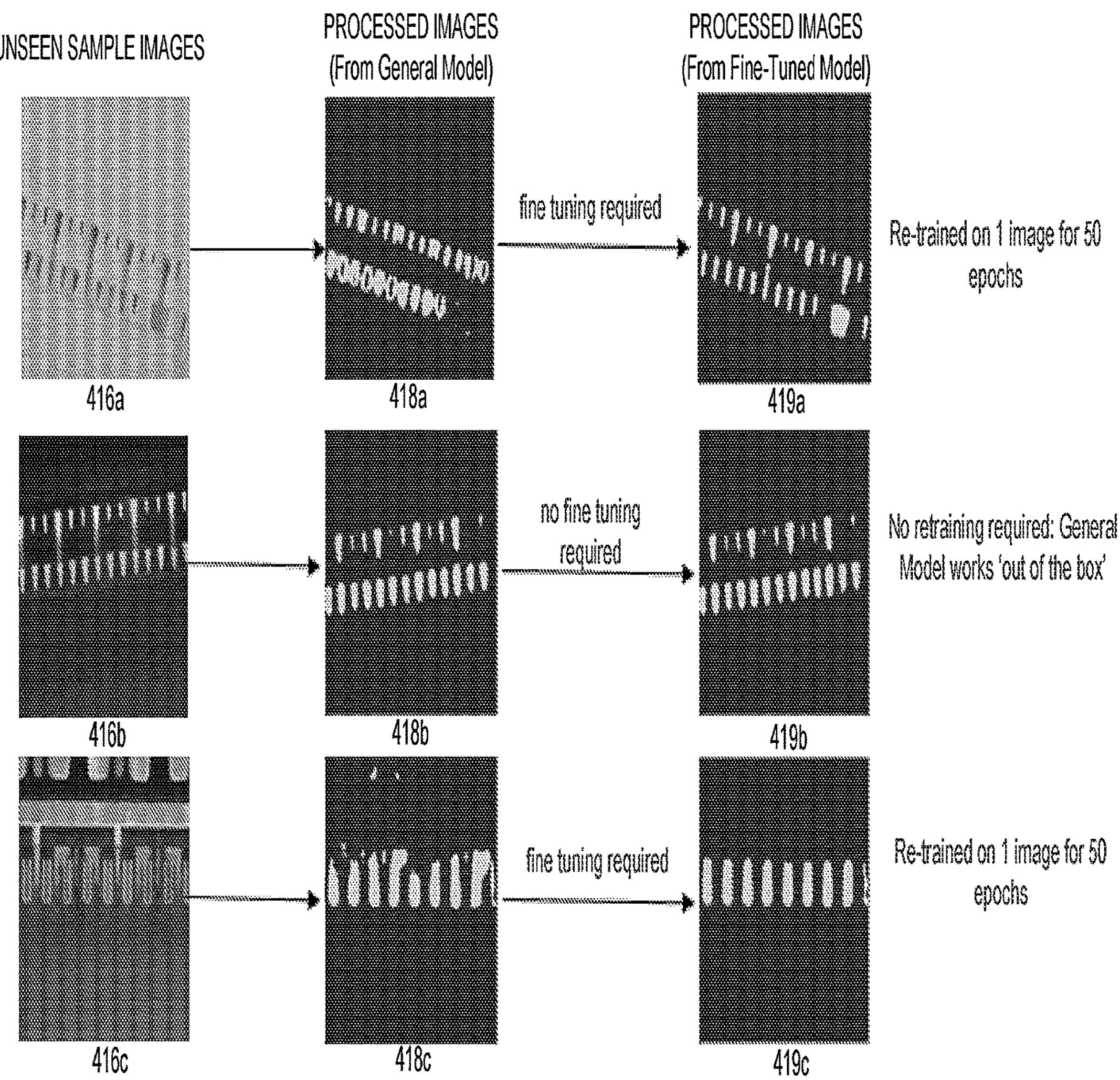
FIG. 4B depicts examples results where unseen sample images are processed through a general model and then a fine-tuned model.

As described above, the general model 404 can be fine-tuned based on the sample data or the specific requirements of the project or device to which the model 404 is deployed. FIG. 4B depicts examples results where the unseen sample images 416*a-c* are processed through the general model 404, which provides the respective processed images 418*a-c*. These resulting images are reviewed to determine whether the general model 404 should be fine-tuned to process the sample images 416. As depicted, the general model 404 was fine-tuned (retrained with an image for a number of epochs) to provide the resulting images 419*a* and 419*c* from the sample images 416*a* and 416*c*, respectively. In some embodiments, the data general model 404 is fine-tuned with new images that are determined/selected based on user feedback when the output (e.g., predictions) for the new images is not accurate enough. Fine-tuning was not required to provide the results 419*b* for the sample image 416*b*. By first employing the general model 404 to processing the sample images, overall fewer images and therefore less training is required to produce the final resulting images 419. For example, the system requires ~5-10% less training data than training a new model for each device or project.

Feedback Loop

Figure 5:
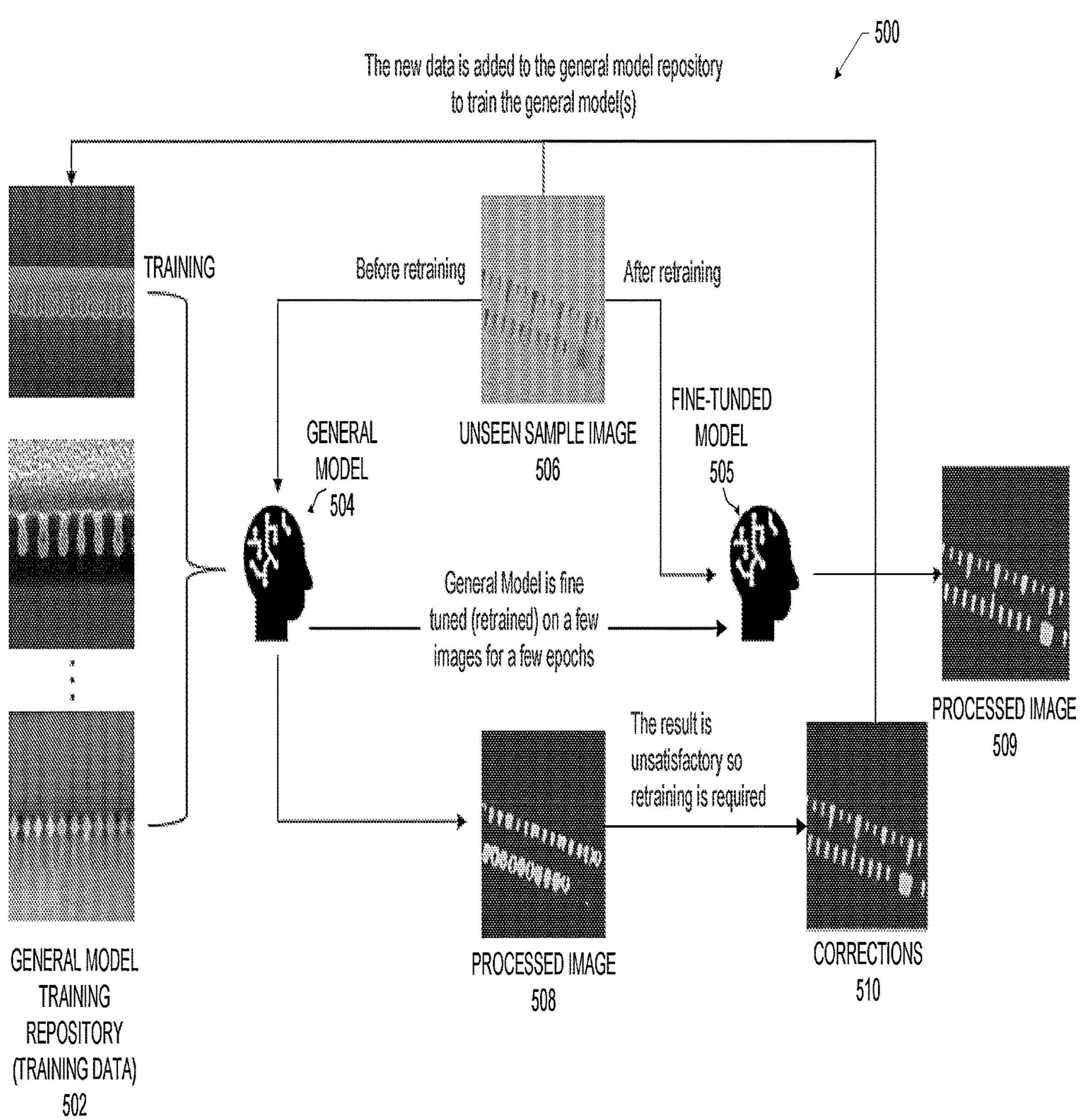
FIG. 5 depicts a feedback loop where training data is updated with the sample images as they are processed by the described system.

FIG. 5 depicts an example feedback loop 500 where the training data 502 is updated with the sample images 506 as they are processed by the described system. As depicted, the unseen sample image 506 is processed through the general model 504 to determine the processed image 508, which does not match the expected result. The processed image assessment can be done either via visual inspection or by measuring the similarity of the processed image to a reference by, for example, the Jaccard index. The general model 504 is fine-tuned (retraining) with incorrectly processed image 506 (the related microscopy image) into the fine-tuned model 505. The incorrectly processed image 506 is supplied with labels 510 denoting how to correctly process the image 506. In some embodiments, labels 510 include corrections or annotations provided by a user. The model, 505, then learns how to correctly process the previously incorrectly processed image. The retraining considers incorrectly processed image 506, labels 510, and previous data 502. A further unseen sample image 506 is then processed through the fine-tuned model 505 to determine the processed image 509, which can then be employed by the system or device for further processing, or if it too is incorrectly processed the retrained model 505 can be further retrained. In this way, the general models employed by a system adapt to context and project/customer specific data. These more finely-tuned general models can be deployed for use throughout a customer site or to related devices so that little to no additional fine-tuning is required for projects.

User Interface

Figure 7:
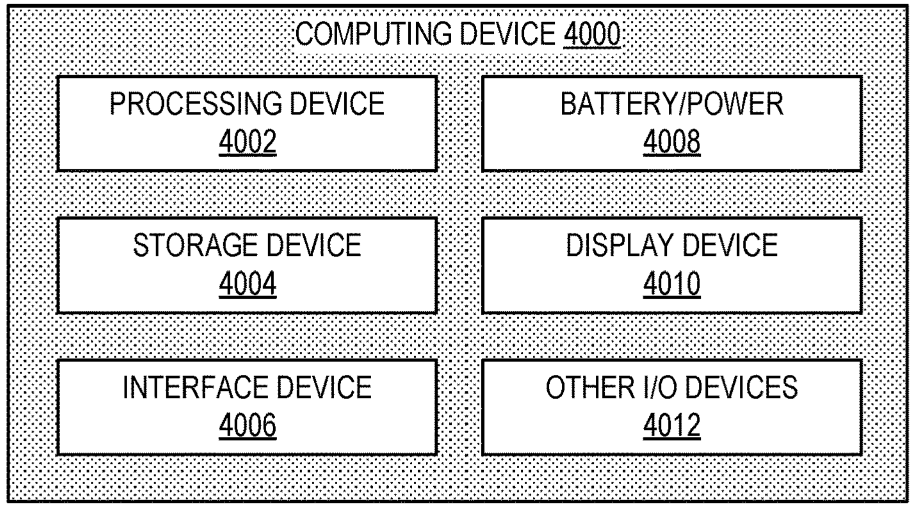
FIG. 7 is a block diagram of an example computing device that may perform some or all of the scientific instrument support methods disclosed herein, in accordance with various embodiments.
Figure 8:
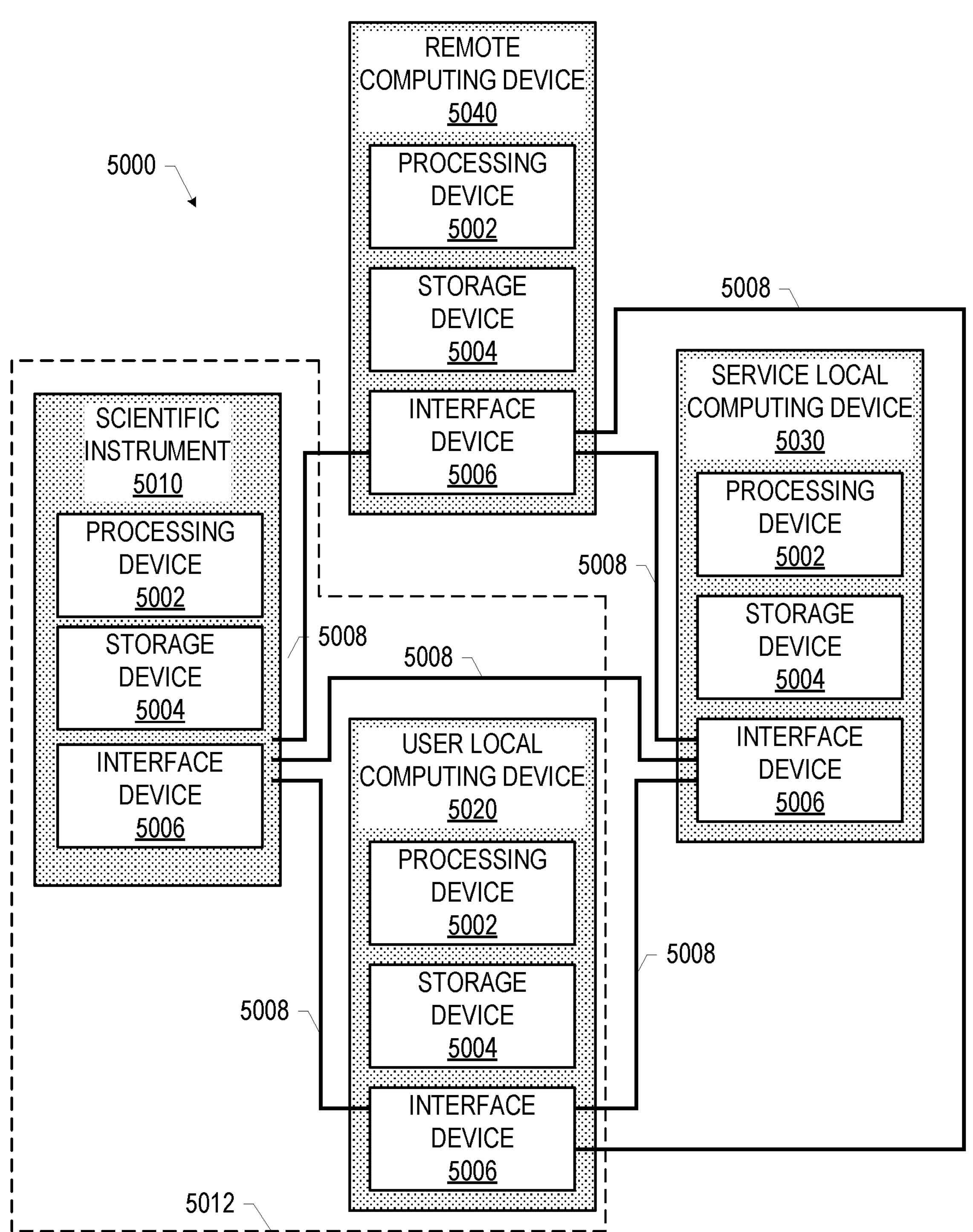
FIG. 8 is a block diagram of an example scientific instrument support system in which some or all of the scientific instrument support methods disclosed herein may be performed, in accordance with various embodiments.

The scientific instrument support methods disclosed herein may include interactions with a human user (e.g., via the user local computing device 5020 discussed herein with reference to FIG. 8). These interactions may include providing information to the user (e.g., information regarding the operation of a scientific instrument such as the scientific instrument 5010 of FIG. 8, information regarding a sample being analyzed or other test or measurement performed by a scientific instrument, information retrieved from a local or remote database, or other information) or providing an option for a user to input commands (e.g., to control the operation of a scientific instrument such as the scientific instrument 5010 of FIG. 8, or to control the analysis of data generated by a scientific instrument), queries (e.g., to a local or remote database), or other information. In some embodiments, these interactions may be performed through a GUI that includes a visual display on a display device (e.g., the display device 4010 discussed herein with reference to FIG. 7) that provides outputs to the user and/or prompts the user to provide inputs (e.g., via one or more input devices, such as a keyboard, mouse, trackpad, or touchscreen, included in the other I/O devices 4012 discussed herein with reference to FIG. 7). The scientific instrument support systems disclosed herein may include any suitable GUIs for interaction with a user.

Figure 6:
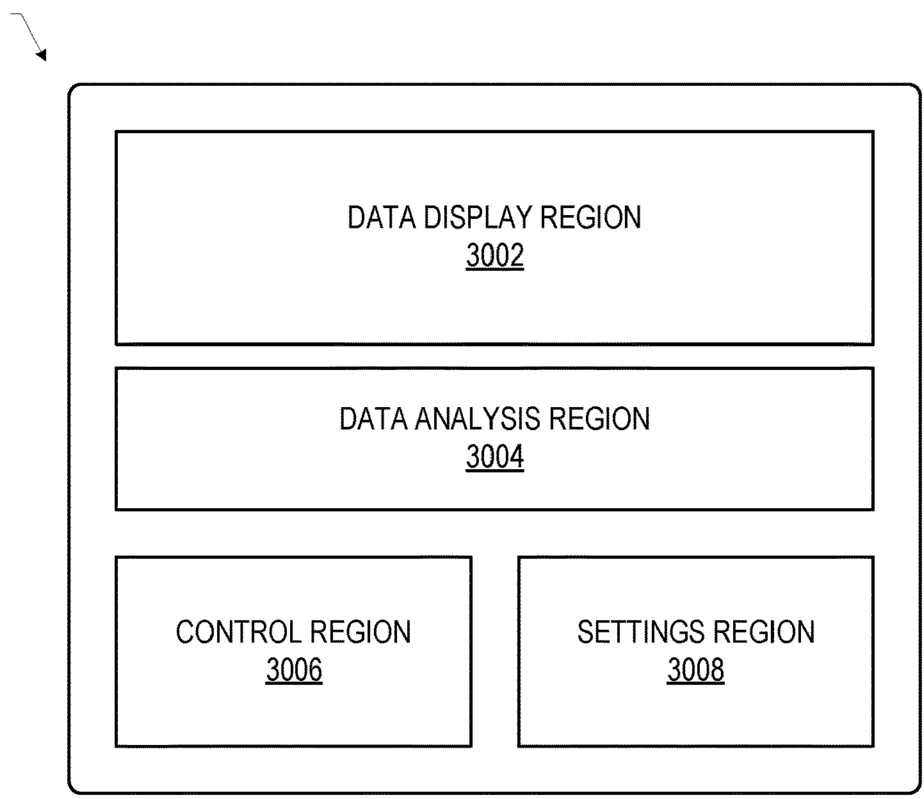
FIG. 6 is an example of a graphical user interface (GUI) that may be used in the performance of some or all of the support methods disclosed herein, in accordance with various embodiments.

FIG. 6 depicts an example GUI 3000 that may be used in the performance of some or all of the support methods disclosed herein, in accordance with various embodiments. As noted above, the GUI 3000 may be provided on a display device (e.g., the display device 4010 discussed herein with reference to FIG. 7) of a computing device (e.g., the computing device 4000 discussed herein with reference to FIG. 7) of a scientific instrument support system (e.g., the scientific instrument support system 5000 discussed herein with reference to FIG. 8), and a user may interact with the GUI 3000 using any suitable input device (e.g., any of the input devices included in the other I/O devices 4012 discussed herein with reference to FIG. 7) and input technique (e.g., movement of a cursor, motion capture, facial recognition, gesture detection, voice recognition, actuation of buttons, etc.).

The GUI 3000 may include a data display region 3002, a data analysis region 3004, a scientific instrument control region 3006, and a settings region 3008. The particular number and arrangement of regions depicted in FIG. 6 is simply illustrative, and any number and arrangement of regions, including any desired features, may be included in a GUI 3000. The data display region 3002 may display data generated by a scientific instrument (e.g., the scientific instrument 5010 discussed herein with reference to FIG. 8).

The data analysis region 3004 may display the results of data analysis (e.g., the results of analyzing the data illustrated in the data display region 3002 and/or other data). For example, the data analysis region 3004 may processed image data where objects of interest are identified. In some embodiments, the data display region 3002 and the data analysis region 3004 may be combined in the GUI 3000 (e.g., to include data output from a scientific instrument, and some analysis of the data, in a common graph or region).

The scientific instrument control region 3006 may include options that allow the user to control a scientific instrument (e.g., the scientific instrument 5010 discussed herein with reference to FIG. 8). The settings region 3008 may include options that allow the user to control the features and functions of the GUI 3000 (and/or other GUIs) and/or perform common computing operations with respect to the data display region 3002 and data analysis region 3004 (e.g., saving data on a storage device, such as the storage device 4004 discussed herein with reference to FIG. 7, sending data to another user, labeling data, etc.).

Computing Device

As noted above, the scientific instrument support module 1000 may be implemented by one or more computing devices. FIG. 7 is a block diagram of a computing device 4000 that may perform some or all of the scientific instrument support methods disclosed herein, in accordance with various embodiments. In some embodiments, the scientific instrument support module 1000 may be implemented by a single computing device 4000 or by multiple computing devices 4000. Further, as discussed below, a computing device 4000 (or multiple computing devices 4000) that implements the scientific instrument support module 1000 may be part of one or more of the scientific instrument 5010, the user local computing device 5020, the service local computing device 5030, or the remote computing device 5040 of FIG. 8.

The computing device 4000 of FIG. 7 is illustrated as having a number of components, but any one or more of these components may be omitted or duplicated, as suitable for the application and setting. In some embodiments, some or all of the components included in the computing device 4000 may be attached to one or more motherboards and enclosed in a housing (e.g., including plastic, metal, and/or other materials). In some embodiments, some these components may be fabricated onto a single system-on-a-chip (SoC) (e.g., an SoC may include one or more processing devices 4002 and one or more storage devices 4004). Additionally, in various embodiments, the computing device 4000 may not include one or more of the components illustrated in FIG. 7, but may include interface circuitry (not shown) for coupling to the one or more components using any suitable interface (e.g., a Universal Serial Bus (USB) interface, a High-Definition Multimedia Interface (HDMI) interface, a Controller Area Network (CAN) interface, a Serial Peripheral Interface (SPI) interface, an Ethernet interface, a wireless interface, or any other appropriate interface). For example, the computing device 4000 may not include a display device 4010, but may include display device interface circuitry (e.g., a connector and driver circuitry) to which a display device 4010 may be coupled.

The computing device 4000 may include a processing device 4002 (e.g., one or more processing devices). As used herein, the term "processing device" may refer to any device or portion of a device that processes electronic data from registers and/or memory to transform that electronic data into other electronic data that may be stored in registers and/or memory. The processing device 4002 may include one or more digital signal processors (DSPs), application-specific integrated circuits (ASICs), central processing units (CPUs), graphics processing units (GPUs), cryptoprocessors (specialized processors that execute cryptographic algorithms within hardware), server processors, or any other suitable processing devices.

The computing device 4000 may include a storage device 4004 (e.g., one or more storage devices). The storage device 4004 may include one or more memory devices such as random access memory (RAM) (e.g., static RAM (SRAM) devices, magnetic RAM (MRAM) devices, dynamic RAM (DRAM) devices, resistive RAM (RRAM) devices, or conductive-bridging RAM (CBRAM) devices), hard drive-based memory devices, solid-state memory devices, networked drives, cloud drives, or any combination of memory devices. In some embodiments, the storage device 4004 may include memory that shares a die with a processing device 4002. In such an embodiment, the memory may be used as cache memory and may include embedded dynamic random access memory (eDRAM) or spin transfer torque magnetic random access memory (STT-MRAM), for example. In some embodiments, the storage device 4004 may include non-transitory computer readable media having instructions thereon that, when executed by one or more processing devices (e.g., the processing device 4002), cause the computing device 4000 to perform any appropriate ones of or portions of the methods disclosed herein.

The computing device 4000 may include an interface device 4006 (e.g., one or more interface devices 4006). The interface device 4006 may include one or more communication chips, connectors, and/or other hardware and software to govern communications between the computing device 4000 and other computing devices. For example, the interface device 4006 may include circuitry for managing wireless communications for the transfer of data to and from the computing device 4000. The term "wireless" and its derivatives may be used to describe circuits, devices, systems, methods, techniques, communications channels, and the like, that may communicate data through the use of modulated electromagnetic radiation through a nonsolid medium. The term does not imply that the associated devices do not contain any wires, although in some embodiments they might not. Circuitry included in the interface device 4006 for managing wireless communications may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultra-mobile broadband (UMB) project (also referred to as "3GPP2"), etc.). In some embodiments, circuitry included in the interface device 4006 for managing wireless communications may operate in accordance with a Global System for Mobile Communication (GSM), General Packet Radio Service (GPRS), Universal Mobile Telecommunications System (UMTS), High Speed Packet Access (HSPA), Evolved HSPA (E-HSPA), or LTE network. In some embodiments, circuitry included in the interface device 4006 for managing wireless communications may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). In some embodiments, circuitry included in the interface device 4006 for managing wireless communications may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. In some embodiments, the interface device 4006 may include one or more antennas (e.g., one or more antenna arrays) to receipt and/or transmission of wireless communications.

In some embodiments, the interface device 4006 may include circuitry for managing wired communications, such as electrical, optical, or any other suitable communication protocols. For example, the interface device 4006 may include circuitry to support communications in accordance with Ethernet technologies. In some embodiments, the interface device 4006 may support both wireless and wired communication, and/or may support multiple wired communication protocols and/or multiple wireless communication protocols. For example, a first set of circuitry of the interface device 4006 may be dedicated to shorter-range wireless communications such as Wi-Fi or Bluetooth, and a second set of circuitry of the interface device 4006 may be dedicated to longer-range wireless communications such as global positioning system (GPS), EDGE, GPRS, CDMA, WiMAX, LTE, EV-DO, or others. In some embodiments, a first set of circuitry of the interface device 4006 may be dedicated to wireless communications, and a second set of circuitry of the interface device 4006 may be dedicated to wired communications.

The computing device 4000 may include battery/power circuitry 4008. The battery/power circuitry 4008 may include one or more energy storage devices (e.g., batteries or capacitors) and/or circuitry for coupling components of the computing device 4000 to an energy source separate from the computing device 4000 (e.g., AC line power).

The computing device 4000 may include a display device 4010 (e.g., multiple display devices). The display device 4010 may include any visual indicators, such as a heads-up display, a computer monitor, a projector, a touchscreen display, a liquid crystal display (LCD), a light-emitting diode display, or a flat panel display.

The computing device 4000 may include other input/output (I/O) devices 4012. The other I/O devices 4012 may include one or more audio output devices (e.g., speakers, headsets, earbuds, alarms, etc.), one or more audio input devices (e.g., microphones or microphone arrays), location devices (e.g., GPS devices in communication with a satellite-based system to receive a location of the computing device 4000, as known in the art), audio codecs, video codecs, printers, sensors (e.g., thermocouples or other temperature sensors, humidity sensors, pressure sensors, vibration sensors, accelerometers, gyroscopes, etc.), image capture devices such as cameras, keyboards, cursor control devices such as a mouse, a stylus, a trackball, or a touchpad, bar code readers, Quick Response (QR) code readers, or radio frequency identification (RFID) readers, for example.

The computing device 4000 may have any suitable form factor for its application and setting, such as a handheld or mobile computing device (e.g., a cell phone, a smart phone, a mobile internet device, a tablet computer, a laptop computer, a netbook computer, an ultrabook computer, a personal digital assistant (PDA), an ultra-mobile personal computer, etc.), a desktop computing device, or a server computing device or other networked computing component.

Scientific Instrument Support System

One or more computing devices implementing any of the scientific instrument support modules or methods disclosed herein may be part of a scientific instrument support system. FIG. 8 is a block diagram of an example scientific instrument support system 5000 in which some or all of the scientific instrument support methods disclosed herein may be performed, in accordance with various embodiments. The scientific instrument support modules and methods disclosed herein (e.g., the scientific instrument support module 1000 of FIG. 1 and the method 2000 of FIG. 2) may be implemented by one or more of the scientific instrument 5010, the user local computing device 5020, the service local computing device 5030, or the remote computing device 5040 of the scientific instrument support system 5000.

Any of the scientific instrument 5010, the user local computing device 5020, the service local computing device 5030, or the remote computing device 5040 may include any of the embodiments of the computing device 4000 discussed herein with reference to FIG. 7, and any of the scientific instrument 5010, the user local computing device 5020, the service local computing device 5030, or the remote computing device 5040 may take the form of any appropriate ones of the embodiments of the computing device 4000 discussed herein with reference to FIG. 7.

The scientific instrument 5010, the user local computing device 5020, the service local computing device 5030, or the remote computing device 5040 may each include a processing device 5002, a storage device 5004, and an interface device 5006. The processing device 5002 may take any suitable form, including the form of any of the processing devices 4002 discussed herein with reference to FIG. 7, and the processing devices 5002 included in different ones of the scientific instrument 5010, the user local computing device 5020, the service local computing device 5030, or the remote computing device 5040 may take the same form or different forms. The storage device 5004 may take any suitable form, including the form of any of the storage devices 5004 discussed herein with reference to FIG. 7, and the storage devices 5004 included in different ones of the scientific instrument 5010, the user local computing device 5020, the service local computing device 5030, or the remote computing device 5040 may take the same form or different forms. The interface device 5006 may take any suitable form, including the form of any of the interface devices 4006 discussed herein with reference to FIG. 7, and the interface devices 5006 included in different ones of the scientific instrument 5010, the user local computing device 5020, the service local computing device 5030, or the remote computing device 5040 may take the same form or different forms.

The scientific instrument 5010, the user local computing device 5020, the service local computing device 5030, and the remote computing device 5040 may be in communication with other elements of the scientific instrument support system 5000 via communication pathways 5008. The communication pathways 5008 may communicatively couple the interface devices 5006 of different ones of the elements of the scientific instrument support system 5000, as shown, and may be wired or wireless communication pathways (e.g., in accordance with any of the communication techniques discussed herein with reference to the interface devices 4006 of the computing device 4000 of FIG. 7). The particular scientific instrument support system 5000 depicted in FIG. 8 includes communication pathways between each pair of the scientific instrument 5010, the user local computing device 5020, the service local computing device 5030, and the remote computing device 5040, but this "fully connected" implementation is simply illustrative, and in various embodiments, various ones of the communication pathways 5008 may be absent. For example, in some embodiments, a service local computing device 5030 may not have a direct communication pathway 5008 between its interface device 5006 and the interface device 5006 of the scientific instrument 5010, but may instead communicate with the scientific instrument 5010 via the communication pathway 5008 between the service local computing device 5030 and the user local computing device 5020 and the communication pathway 5008 between the user local computing device 5020 and the scientific instrument 5010.

The scientific instrument 5010 may include any appropriate scientific instrument. In some embodiments, the scientific instrument 5010 includes a charged particle microscope.

The user local computing device 5020 may be a computing device (e.g., in accordance with any of the embodiments of the computing device 4000 discussed herein) that is local to a user of the scientific instrument 5010. In some embodiments, the user local computing device 5020 may also be local to the scientific instrument 5010, but this need not be the case; for example, a user local computing device 5020 that is in a user's home or office may be remote from, but in communication with, the scientific instrument 5010 so that the user may use the user local computing device 5020 to control and/or access data from the scientific instrument 5010. In some embodiments, the user local computing device 5020 may be a laptop, smartphone, or tablet device. In some embodiments the user local computing device 5020 may be a portable computing device.

The service local computing device 5030 may be a computing device (e.g., in accordance with any of the embodiments of the computing device 4000 discussed herein) that is local to an entity that services the scientific instrument 5010. For example, the service local computing device 5030 may be local to a manufacturer of the scientific instrument 5010 or to a third-party service company. In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to receive data regarding the operation of the scientific instrument 5010, the user local computing device 5020, and/or the remote computing device 5040 (e.g., the results of self-tests of the scientific instrument 5010, calibration coefficients used by the scientific instrument 5010, the measurements of sensors associated with the scientific instrument 5010, etc.). In some embodiments, the service local computing device 5030 may communicate with the scientific instrument 5010, the user local computing device 5020, and/or the remote computing device 5040 (e.g., via a direct communication pathway 5008 or via multiple "indirect" communication pathways 5008, as discussed above) to transmit data to the scientific instrument 5010, the user local computing device 5020, and/or the remote computing device 5040 (e.g., to update programmed instructions, such as firmware, in the scientific instrument 5010, to initiate the performance of test or calibration sequences in the scientific instrument 5010, to update programmed instructions, such as software, in the user local computing device 5020 or the remote computing device 5040, etc.). A user of the scientific instrument 5010 may utilize the scientific instrument 5010 or the user local computing device 5020 to communicate with the service local computing device 5030 to report a problem with the scientific instrument 5010 or the user local computing device 5020, to request a visit from a technician to improve the operation of the scientific instrument 5010, to order consumables or replacement parts associated with the scientific instrument 5010, or for other purposes.

The remote computing device 5040 may be a computing device (e.g., in accordance with any of the embodiments of the computing device 4000 discussed herein) that is remote from the scientific instrument 5010 and/or from the user local computing device 5020. In some embodiments, the remote computing device 5040 may be included in a datacenter or other large-scale server environment. In some embodiments, the remote computing device 5040 may include network-attached storage (e.g., as part of the storage device 5004). The remote computing device 5040 may store data generated by the scientific instrument 5010, perform analyses of the data generated by the scientific instrument 5010 (e.g., in accordance with programmed instructions), facilitate communication between the user local computing device 5020 and the scientific instrument 5010, and/or facilitate communication between the service local computing device 5030 and the scientific instrument 5010.

In some embodiments, one or more of the elements of the scientific instrument support system 5000 illustrated in FIG. 8 may not be present. Further, in some embodiments, multiple ones of various ones of the elements of the scientific instrument support system 5000 of FIG. 8 may be present. For example, a scientific instrument support system 5000 may include multiple user local computing devices 5020 (e.g., different user local computing devices 5020 associated with different users or in different locations). In another example, a scientific instrument support system 5000 may include multiple scientific instruments 5010, all in communication with service local computing device 5030 and/or a remote computing device 5040; in such an embodiment, the service local computing device 5030 may monitor these multiple scientific instruments 5010, and the service local computing device 5030 may cause updates or other information may be "broadcast" to multiple scientific instruments 5010 at the same time. Different ones of the scientific instruments 5010 in a scientific instrument support system 5000 may be located close to one another (e.g., in the same room) or farther from one another (e.g., on different floors of a building, in different buildings, in different cities, and the like.). In some embodiments, a scientific instrument 5010 may be connected to an Internet-of-Things (IoT) stack that allows for command and control of the scientific instrument 5010 through a web-based application, a virtual or augmented reality application, a mobile application, and/or a desktop application. Any of these applications may be accessed by a user operating the user local computing device 5020 in communication with the scientific instrument 5010 by the intervening remote computing device 5040. In some embodiments, a scientific instrument 5010 may be sold by the manufacturer along with one or more associated user local computing devices 5020 as part of a local scientific instrument computing unit 5012.

In some such embodiments, the remote computing device 5040 and/or the user local computing device 5020 may combine data from different types of scientific instruments 5010 included in a scientific instrument support system 5000.

The following paragraphs provide various examples of the embodiments disclosed herein.

Example 1 is a scientific instrument support apparatus including first logic to first logic to receive, from a charged particle, a microscopy image of a sample; second logic to generate a first processed image by processing the microscopy image through a general machine-learning model trained using a plurality of previously processed microscopy images; third logic to retrain the general machine-learning model with a related microscopy image, wherein the related microscopy image includes a label of an object related to the sample and the related microscopy image is not included in the plurality of previously processed microscopy images; and fourth logic to generate a second processed image, different from the first processed image, by processing the microscopy image through the retrained general machine-learning model.

Example 2 includes the subject matter of Example 1, and further includes: fifth logic to provide the second processed image for display or further processing.

Example 3 includes the subject matter of Example 1 or 2, and further specifies that the third logic is further configured to determine or receive an indication that the first processed image is unsatisfactory.

Example 4 includes the subject matter of any of Examples 1-3, and further specifies that the retraining of the general machine-learning model is performed at least in part in response to the indication that the first processed image is unsatisfactory.

Example 5 includes the subject matter of any of Examples 1-4, and further specifies that the third logic is configured to determine that the first processed image is unsatisfactory based on the Jaccard index.

Example 6 includes the subject matter of any of Examples 1-5, and further specifies that the indication that the first processed image is unsatisfactory is received from a user interface.

Example 7 includes the subject matter of any of Examples 1-6, and further specifies that the third logic is further configured to select the related microscopy image based on a metric quantitating the similarity of the first processed image to an expected processing results of the microscopy image.

Example 8 includes the subject matter of any of Examples 1-7, and further specifies that the label includes corrections or annotations provided by a user.

Example 9 includes the subject matter of any of Examples 1-8, and further specifies that the third logic is further configured to select the related microscopy image based on input provided by a user via an interface.

Example 10 includes the subject matter of any of Examples 1-9, and further specifies that the microscopy image is added to the previously processed microscopy images to form a set of updated microscopy images.

Example 11 includes the subject matter of any of Examples 1-10, and further specifies that a second general machine-learning model is trained by a second scientific instrument support apparatus using the set of updated microscopy images.

Example 12 includes the subject matter of any of Examples 1-11, and further specifies that the second scientific instrument support apparatus employs the second general machine-learning model to generate processed images.

Example 13 includes the subject matter of any of Examples 1-12, and further specifies that the general machine-learning model is trained through supervised learning using data augmentation with previously annotated data.

Example 14 includes the subject matter of any of Examples 1-13, and further specifies that the sample includes a semiconductor device.

Example 15 includes the subject matter of any of Examples 1-14, and further specifies that each of the processed microscopy images are of the semiconductor device.

Example 16 includes the subject matter of any of Examples 1-15, and further specifies that the microscopy image comprises a TEM image or SEM image.

Example 17 includes the subject matter of any of Examples 1-16, and further specifies that the general machine-learning model comprises a convolutional neural network.

Example 18 includes the subject matter of any of Examples 1-17, and further specifies that the scientific instrument support apparatus is deployed to the charged particle microscope.

Example 19 includes the subject matter of any of Examples 1-18, and further specifies that the related microscopy image comprises the first processed image that includes the label of the object related to the sample.

Example 20 is a method for method for scientific instrument support executed by an electronic processor. The method includes receiving, from a charged particle microscope, a microscopy image of a sample; generating a first processed image by processing the microscopy image through a general machine-learning model trained using a plurality of previously processed microscopy images; determining an indication that the first processed image is unsatisfactory; retraining the general machine-learning model with a related microscopy image in response to the determination that the first processed image is unsatisfactory; and generating a second processed image, different from the first processed image, by processing the microscopy image through the retrained general machine-learning model.

Example 21 includes the subject matter of Example 20, and further specifies that the related microscopy image includes a label of an object related to the sample and the related microscopy image is not included in the plurality of previously processed microscopy images.

Example 22 includes the subject matter of any of Examples 20 or 21, and further specifies that the label includes corrections or annotations provided by a user.

Example 23 includes the subject matter of any of Examples 20-22, and further specifies that the plurality of previously processed microscopy images is fine-tuned based on a type of samples processed or specific requirements of a project or a device comprising the electronic processor.

Example 24 includes the subject matter of any of Examples 20-23, and further includes providing the second processed image for display or further processing.

Example 25 includes the subject matter of any of Examples 20-24, and further specifies that the indication that the first processed image is unsatisfactory is determined or received.

Example 26 includes the subject matter of any of Examples 20-25, and further specifies that the indication that the first processed image is unsatisfactory is received from a user interface.

Example 27 includes the subject matter of any of Examples 20-26, and further specifies that the first processed image is determined as unsatisfactory based on the Jaccard index.

Example 28 includes the subject matter of any of Examples 20-27, and further specifies that the related microscopy image is selected based on a metric quantitating the similarity of the first processed image to an expected processing results of the microscopy image.

Example 29 includes the subject matter of any of Examples 20-28, and further specifies that the related microscopy image is selected based on input provided by a user via an interface.

Example 30 includes the subject matter of any of Examples 20-29, and further specifies that the microscopy image is added to the previously processed microscopy images to form a set of updated microscopy images.

Example 31 includes the subject matter of any of Examples 20-30, and further specifies that a second general machine-learning model is trained by a scientific instrument support apparatus using the set of updated microscopy images.

Example 32 includes the subject matter of any of Examples 20-31, and further specifies that the scientific instrument support apparatus employs the second general machine-learning model to generate processed images.

Example 33 includes the subject matter of any of Examples 20-32, and further specifies that the general machine-learning model is trained through supervised learning using data augmentation with previously annotated data.

Example 34 includes the subject matter of any of Examples 20-33, and further specifies that the sample includes a semiconductor device.

Example 35 includes the subject matter of any of Examples 20-34, and further specifies that each of the processed microscopy images are of the semiconductor device.

Example 36 includes the subject matter of any of Examples 20-35, and further specifies that the microscopy image comprises a TEM image or SEM image.

Example 37 includes the subject matter of any of Examples 20-36, and further specifies that the general machine-learning model comprises a convolutional neural network.

Example 38 includes the subject matter of any of Examples 20-37, and further specifies that the method is execute by the charged particle microscope.

Example 39 includes the subject matter of any of Examples 20-38, and further specifies that the related microscopy image comprises the first processed image that includes the label of the object related to the sample.

Example 40 is a scientific instrument support system that includes a charged particle microscope and an electronic processor. The electronic processor is configured to: receive, from the charged particle microscope, a microscopy image of a sample; generate a first processed image by processing the microscopy image through a general machine-learning model trained using a plurality of previously processed microscopy images; select a related microscopy image based on a metric quantitating the similarity of the first processed image to an expected processing results of the microscopy image; retrain the general machine-learning model with the related microscopy image; and generate a second processed image, different from the first processed image, by processing the microscopy image through the retrained general machine-learning model.

Example 41 includes the subject matter of Example 40, and further specifies that the charged particle microscope is configured to perform a transmission electron microscopy, scanning electron microscopy, scanning transmission electron microscopy, or an ion beam microscopy.

Example 42 includes the subject matter of any of Examples 40 or 41, and further specifies that the related microscopy image includes a label of an object related to the sample and the related microscopy image is not included in the plurality of previously processed microscopy images.

Example 43 includes the subject matter of any of Examples 40-42, and further specifies that the label includes corrections or annotations provided by a user.

Example 44 includes the subject matter of Example 40-43, and further specifies that the electronic processor is configured to determine or receive an indication that the first processed image is unsatisfactory.

Example 45 includes the subject matter of any of Examples 40-44, and further specifies that the electronic processor is configured to retrain the general machine-learning model in response to the indication that the first processed image is unsatisfactory.

Example 46 includes the subject matter of any of Examples 40-45, and further specifies that the electronic processor is configured to determine that the first processed image is unsatisfactory based on the Jaccard index.

Example 47 includes the subject matter of any of Examples 40-46, and further specifies that the indication that the first processed image is unsatisfactory is received from a user interface.

Example 48 includes the subject matter of any of Examples 40-47, and further specifies that the plurality of previously processed microscopy images is fine-tuned based on a type of samples processed or specific requirements of a project or a device comprising the electronic processor.

Example 49 includes the subject matter of any of Examples 40-48, further specifies that the electronic processor is configured to provide the second processed image for display or further processing.

Example 50 includes the subject matter of any of Examples 40-49, and further specifies that the electronic processor is configured to select the related microscopy image based on a metric quantitating the similarity of the first processed image to an expected processing results of the microscopy image.

Example 51 includes the subject matter of any of Examples 40-50, and further specifies that the electronic processor is configured to select the related microscopy image based on input provided by a user via an interface.

Example 52 includes the subject matter of any of Examples 40-51, and further specifies that the electronic processor is configured to add the microscopy image to the previously processed microscopy images to form a set of updated microscopy images.

Example 53 includes the subject matter of any of Examples 40-52, and further specifies that a second general machine-learning model is trained by a scientific instrument support apparatus using the set of updated microscopy images.

Example 54 includes the subject matter of any of Examples 40-53, and further specifies that the scientific instrument support apparatus employs the second general machine-learning model to generate processed images.

Example 55 includes the subject matter of any of Examples 40-54, and further specifies that the general machine-learning model is trained through supervised learning using data augmentation with previously annotated data.

Example 56 includes the subject matter of any of Examples 40-55, and further specifies that the sample includes a semiconductor device.

Example 57 includes the subject matter of any of Examples 40-56, and further specifies that each of the processed microscopy images are of the semiconductor device.

Example 58 includes the subject matter of any of Examples 40-57, and further specifies that the microscopy image comprises a TEM image or SEM image.

Example 59 includes the subject matter of any of Examples 40-58, and further specifies that the general machine-learning model comprises a convolutional neural network.

Example 60 includes the subject matter of any of Examples 40-59, and further specifies that the method is execute by the charged particle microscope.

Example 61 includes the subject matter of any of Examples 40-61, and further specifies that the related microscopy image comprises the first processed image that includes the label of the object related to the sample.

The invention claimed is:

1. A scientific instrument support apparatus, comprising:

first logic to receive, from a charged particle microscope, a microscopy image of a sample;

second logic to generate a first processed image by applying image processing to the microscopy image through a general machine-learning model trained using a plurality of previously processed microscopy images, wherein the first processed image is an output of the general machine-learning model;

third logic to, based on the first processed image being unsatisfactory, select a related microscopy image based on a metric quantitating the similarity of the first processed image to an expected processing results of the microscopy image and to retrain the general machine-learning model with new training data including the related microscopy image, wherein the related microscopy image includes the first processed image supplied with a label of an object related to the sample and the related microscopy image is not included in the plurality of previously processed microscopy images; and fourth logic to generate a second processed image, different from the first processed image, by processing the microscopy image through the retrained general machine-learning model.

2. The scientific instrument support apparatus of claim 1, fifth logic to provide the second processed image for display or further processing.

3. The scientific instrument support apparatus of claim 1, wherein the third logic is configured to determine that the first processed image is unsatisfactory based on the Jaccard index.

4. The scientific instrument support apparatus of claim 1, wherein the label includes corrections or annotations provided by a user.

5. The scientific instrument support apparatus of claim 1, wherein the third logic is further configured to select the related microscopy image based on input provided by a user via an interface.

6. The scientific instrument support apparatus of claim 1, wherein the microscopy image is added to the previously processed microscopy images to form a set of updated microscopy images, wherein a second general machine-learning model is trained by a second scientific instrument support apparatus using the set of updated microscopy images, and wherein the second scientific instrument support apparatus employs the second general machine-learning model to generate processed images.

7. The scientific instrument support apparatus of claim 1, wherein the general machine-learning model is trained through supervised learning using data augmentation with previously annotated data.

8. The scientific instrument support apparatus of claim 1, wherein the sample comprises a semiconductor device, and wherein each of the processed microscopy images are of the semiconductor device.

9. The scientific instrument support apparatus of claim 1, wherein the microscopy image comprises a transmission electron microscopy (TEM) image or scanning electron microscopy (SEM) image.

10. The scientific instrument support apparatus of claim 1, wherein the general machine-learning model comprises a convolutional neural network.

11. The scientific instrument support apparatus of claim 1, wherein the scientific instrument support apparatus is deployed to the charged particle microscope.

12. A method for scientific instrument support executed by an electronic processor, the method comprising:

receiving, from a charged particle microscope, a microscopy image of a sample;

generating a first processed image by applying image processing to the microscopy image through a general machine-learning model trained using a plurality of previously processed microscopy images, wherein the first processed image is an output of the general machine-learning model;

determining an indication that the first processed image is unsatisfactory;

selecting a related microscopy image based on a metric quantitating the similarity of the first processed image to an expected processing result of the microscopy image;

retraining the general machine-learning model with new training data including the related microscopy image in response to the determination that the first processed image is unsatisfactory, wherein the related microscopy image is the first processed image supplied with a label of an object related to the sample; and generating a second processed image, different from the first processed image, by processing the microscopy image through the retrained general machine-learning model.

13. The method of claim 12, wherein the related microscopy image is not included in the plurality of previously processed microscopy images.

14. The method of claim 12, wherein the indication that the first processed image is unsatisfactory is received from a user interface.

15. The method of claim 12, wherein the plurality of previously processed microscopy images is fine-tuned based on a type of samples processed or specific requirements of a project or a device comprising the electronic processor.

16. A scientific instrument support system, comprising:

a charged particle microscope; and an electronic processor configured to:

receive, from the charged particle microscope, a microscopy image of a sample;

generate a first processed image by applying image processing to the microscopy image through a general machine-learning model trained using a plurality of previously processed microscopy images, wherein the first processed image is an output of the general machine-learning model;

select a related microscopy image based on a metric quantitating the similarity of the first processed image to an expected processing results of the microscopy image;

retrain the general machine-learning model with new training data including the related microscopy image, the related image including the first processed image supplied with a label of an object related to the sample; and generate a second processed image, different from the first processed image, by processing the microscopy image through the retrained general machine-learning model.

17. The scientific instrument support system of claim 16, wherein the related microscopy image is not included in the plurality of previously processed microscopy images.

* * * * *